US012124864B2

(12) United States Patent
Hazan et al.

(10) Patent No.: US 12,124,864 B2
(45) Date of Patent: Oct. 22, 2024

(54) METHOD AND SYSTEM FOR SIMULATING A ROBOTIC PROGRAM OF AN INDUSTRIAL ROBOT

(71) Applicant: SIEMENS INDUSTRY SOFTWARE LTD., Tel Aviv (IL)

(72) Inventors: Moshe Hazan, Elad (IL); Yael Barak, Hod-Hasharon (IL); Guy Barak, Rishon le-Zion (IL); Gal Snir, Ramat Gan (IL); Rahav Madvil, Rishon Lezion (IL); Gilles Velay, Garancieres (FR)

(73) Assignee: Siemens Industry Software Ltd., Tel Aviv (IL)

( * ) Notice: Subject to any disclaimer, the term of this patent is extended or adjusted under 35 U.S.C. 154(b) by 191 days.

(21) Appl. No.: 16/481,940

(22) PCT Filed: Jul. 17, 2018

(86) PCT No.: PCT/IB2018/000746
§ 371 (c)(1),
(2) Date: Jul. 30, 2019

(87) PCT Pub. No.: WO2019/016588
PCT Pub. Date: Jan. 24, 2019

(65) Prior Publication Data
US 2020/0042336 A1   Feb. 6, 2020

Related U.S. Application Data

(60) Provisional application No. 62/534,259, filed on Jul. 19, 2017.

(51) Int. Cl.
*G06F 9/455* (2018.01)
*G06F 8/60* (2018.01)
*G06F 8/70* (2018.01)

(52) U.S. Cl.
CPC ............... *G06F 9/455* (2013.01); *G06F 8/70* (2013.01); *G06F 8/60* (2013.01)

(58) Field of Classification Search
CPC ... G06F 9/455; G06F 8/70; G06F 8/60; G06F 30/20
See application file for complete search history.

(56) References Cited

U.S. PATENT DOCUMENTS

| | | | |
|---|---|---|---|
| 6,671,875 B1 | 12/2003 | Lindsey et al. | |
| 2004/0158788 A1 | 8/2004 | Kaszynski et al. | |
| (Continued) | | | |

FOREIGN PATENT DOCUMENTS

| | | |
|---|---|---|
| CN | 103297530 A | 9/2013 |
| CN | 103460150 A | 12/2013 |

*Primary Examiner* — Frank D Mills
*Assistant Examiner* — Kimberly L Jordan
(74) *Attorney, Agent, or Firm* — Laurence A. Greenberg; Werner H. Stemer; Ralph E. Locher

(57) ABSTRACT

A robotic program of an industrial robot is simulated. Inputs on a robotic program of a robot are received. The robotic program of the robot is represented with a neutral representation modeled with a neutral language. Specific code portions of the robotic program in the neutral representation are mapped with corresponding specific code portions of a native representation modeled with a native language of the at least one robot. The robot program in simulated in one of the neutral representation and the native representation. Corresponding code portions of the neutral representation and of the native representation of the robotic program are synchronized via the mapping.

3 Claims, 6 Drawing Sheets

(56) References Cited

U.S. PATENT DOCUMENTS

| | | |
|---|---|---|
| 2005/0055132 A1 | 3/2005 | Matsumoto et al. |
| 2006/0036723 A1* | 2/2006 | Yip ................... H04L 67/327 709/223 |
| 2009/0164202 A1 | 6/2009 | Loennemark et al. |
| 2014/0115561 A1 | 4/2014 | Hessenkämper et al. |
| 2015/0313635 A1 | 11/2015 | Jamali |
| 2015/0343635 A1 | 12/2015 | Linnell et al. |
| 2016/0357838 A1 | 12/2016 | Hoffman et al. |
| 2017/0242778 A1* | 8/2017 | Terras ................ G06F 9/30058 |
| 2017/0291295 A1* | 10/2017 | Gupta ................ G09B 19/0053 |

\* cited by examiner

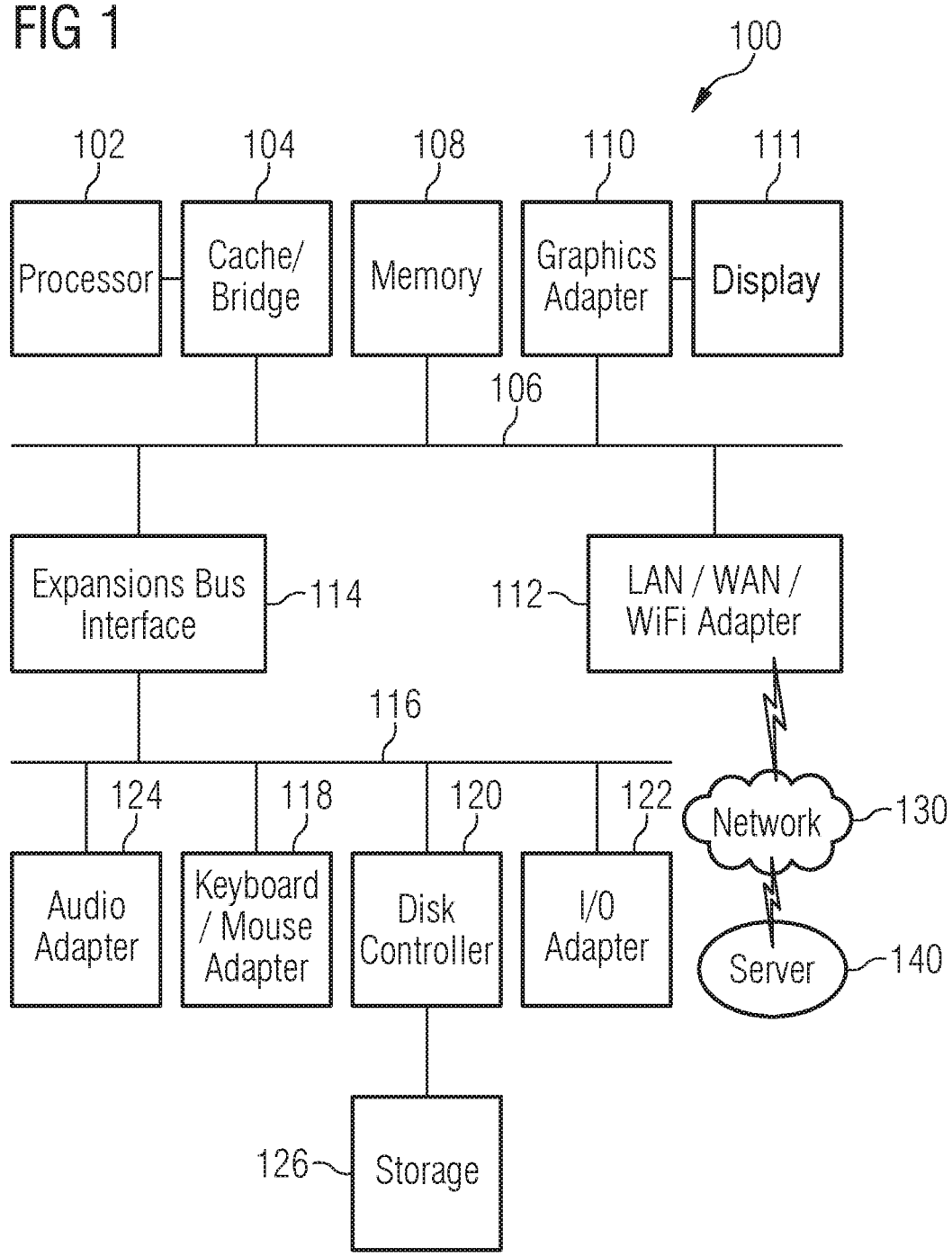

FIG 2A

Example in ABB
MODULE fx_9002_1011_adh_1a01269
!# Process Simulate cn eMServer 12.1 to ABB Rapid download
!# ----------------------------------------
!# CREATED : 02/02/2017 11:26:21 by Procsim10
!# CELL     : z2_adhesive_line_1.ce
!# ROBOT    : z21_120_r01

!# ----------------------------------------
!# -------ROBTARGET
!# ----------------------------------------

!# ----------------------------------------
!# -------TOOL DATA
!# ----------------------------------------
   PERS tooldata t_21120_rnz01_01:=[True, [[-402.85, 0, 642.05], [0, 0, 0, 1]] [0.001, [0, 0, 0], [1, 0, 0, 0], 0, 0, 0]];

!# ----------------------------------------
!# -------XOBJ DATA
!# ----------------------------------------
   PERS wobjdata
w_plat_021_120_1011_001:=[False, True, " ", [[0, 0, 0], [1, 0, 0, 0]], [[1300, 1369, 398.5], [0.7 07107, 0, 0, -0. 707107]]] ;

PROC MOV_fx9002_1011_adh_1a01269 ()
        {{TX_OP xxx}}        ⎱
        {{TX_CMD xxx}}       ⎰ ~201
        TPErase;
        {{TX_CMD xxx}} ~201
            TPWrite "Apply Adhesive - 1A0001269AA";
        {{TX_LOC xxx}} ~201
            MoveJ
adh_1a01269_start,v1500, fine, t_21120_rnz01_01\Wobj:= w_plat_021_120_1011_001;
        {{TX_LOC xxx}} ~201

FIG 2B

{{TX_LOC xxx}}
      DispL adh_1a01269_01_01_005, vBead, bead1, zBead,
t_21120_rnz01_01\WObj:=w_plat_021_120_1011_001\T1:=SegSCA1 {1} ;

{{TX_LOC xxx}}
      DispL\OFF, adh_1a01269_01_01_off, vBead, bead1, zBead,
t_21120_rnz01_01\WObj:=w_plat_021_120_1011_001\T1:=SegSCA1 {1} ;

{{TX_CMD xxx}}
    !Turn Off Bead End Position

{{TX_CMD xxx}}

{{TX_LOC xxx}}
      MoveL
adh_1a01269_01_01_pos, v1500, zBead, t_21120_rnz01_01\Wobj:=
w_plat_021_120_1011_001;
ENDPROC
PROC MOV_fx9002_1011_adh_1a012670 ()

{{TX_OP xxx}}

{{TX_CMD xxx}}
    !Turn Off Bead End Position

{{TX_CMD xxx}}

{{TX_LOC xxx}} ~201
      MoveL
adh_1a01269_05_01_pos, vBead, zBead, t_21120_rnz01_01\Wobj:=
w_plat_021_120_1011_001;

{{TX_LOC xxx}}
      MoveJ lo57, v1500, z20, t_21120_rnz01_01\Wobj:=w_plat_021_120_1011_001;

{{TX_LOC xxx}}
      MoveJ
adh_1a01269_04_03_pre, v1500, z0, t_21120_rnz01_01\Wobj:=
w_plat_021_120_1011_001;

{{TX_CMD xxx}}

{{TX_CMD xxx}}
    !Turn On Bead Start Position

{{TX_LOC xxx}}
      DispL\ON, adh_1a01269_04_03_on, vBead, bead1, zBead,
t_21120_rnz01_01\WObj:=w_plat_021_120_1011_001\T1:=SegSCA1 {1} ;

{{TX_LOC xxx}}
      DispL adh_1a01269_04_03_005, vBead, bead1, zBead,
t_21120_rnz01_01\WObj:=w_plat_021_120_1011_001\T1:=SegSCA1 {1} ;

FIG 2C

```
{{{TX_LOC xxx}}};  ~201
   DispL\OFF, adh_1a01269_04_01_off, vBead, bead1, zBead,
t_21120_rnz01_01\wObj:=w_plat_021_120_1011_001\Tf:=SegSCA1 {1};
{{{TX_CMD xxx}}}
{{{TX_CMD xxx}}}
! Turn Off Bead End Position
{{{TX_LOC xxx}}};
   MoveL
adh_1a01269_04_01_pos, vBead, zBead, t_21120_rnz01_01\Wobj:=w_plat_021_120_1011_001;
{{{TX_CMD xxx}}}
{{{TX_CMD xxx}}}
{{{TX_LOC xxx}}};
{{{TX_CMD xxx}}}
   MoveJ
adh_1a01269_end, v1500, fine, t_21120_rnz01_01\Wobj:=w_plat_021_120_1011_001;
{{{TX_CMD xxx}}}
# WaitTime 2
{{{TX_CMD xxx}}}  ~201
ENDPROC
ENDMODULE
```

FIG 3

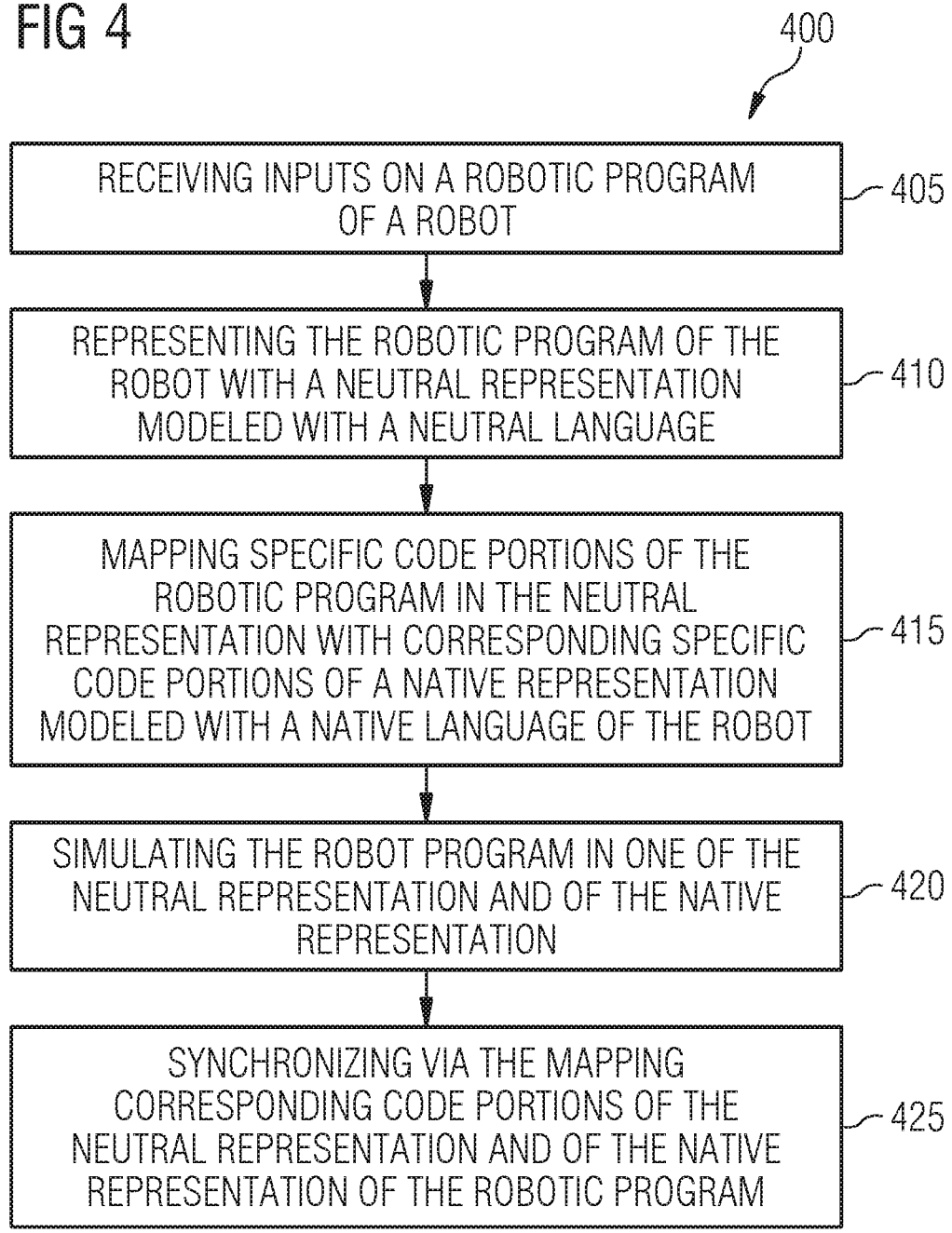

METHOD AND SYSTEM FOR SIMULATING A ROBOTIC PROGRAM OF AN INDUSTRIAL ROBOT

TECHNICAL FIELD

The present disclosure is directed, in general, to computer-aided design, visualization, and manufacturing ("CAD") systems, computer-aided robotics ("CAR") system, product lifecycle management ("PLM") systems, product data management ("PDM") systems, and similar systems, that manage data for products and other items (collectively, "Product Data Management" systems or PDM systems). More specifically, the disclosure is directed to production environment simulation.

BACKGROUND OF THE DISCLOSURE

In robot manufacturing, verification of a complex shop-floor study, in three-dimensional ("3D") view, with several types of robots coming from one or more robot vendors is a routine work. In the market, there are several vendors of industrial robots. Examples of robot vendors include, but are not limited to, KUKA, ABB and FANUC. Different industrial robots have their own specific native robotic languages.

Industrial customers make often use of virtual systems for simulating different industrial robots and their corresponding robotic programs. Such virtual simulation systems are typically based on a common natural language and are usually employed to simulate the motion, the logic like e.g. the signal calculations, and the operations of a plurality of industrial robots in a virtual simulation environment. Such common natural language is typically a high-level and a visual programming language, herein called neutral language. For example, in some of such neutral visual languages the users are able to visualize the location object as a 3D frame instead than a simple numerical visualization.

A supplier of applications for robotic simulation is Siemens Product Lifecycle Management Software. Examples of such applications include, but are not limited to, Process Simulate, NX Robotics, Robot Experts and other Siemens CAR tools.

Some of such applications for robotic simulation may convenient allow to perform one or more of the following actions:

uploading different robotic programs—which may even be in different native languages—into a single virtual system using a same neutral language for the different robotic programs. Such single virtual simulation system may for example contain visual objects, high level OLP ("Off-Line Programming") command objects and other virtual objects. Example of other virtual objects may include, but not limited to, operation\program objects, where such objects may not be necessarily 3D objects, but for example just virtual objects as containers for lists of 3D objects like locations.

performing the relevant virtual validations and modifications;

downloading back all the robot programs coded with different native languages into different program files. The robot programs comprise information regarding the logic and the robotic motion for performing robotic tasks, for example, information regarding locations, positions, commands, signals exchange.

In some simulation scenarios, for example if a problem is encountered during a simulation, robotic engineers do often prefer to visualize the robotic program code in its native language representation instead than exclusively working with the high-level representations provided by the neutral common language. In fact, often only the very expert users who have an advanced knowledge of the neutral language capabilities are able to fully exploit its verification mechanisms.

In the market, there are several robotic simulation applications enabling the verification a robot controller code in its own specific native language. Unfortunately such applications work only with robotic native languages of one single robot vendor. For example, Robot Studio application is specifically working for ABB robotic native languages, KukaSim application is specifically working for KUKA robotic native languages and RoboGuide application is specifically working for FANUC robotic native languages.

Therefore, improved techniques are desirable.

SUMMARY OF THE DISCLOSURE

Various disclosed embodiments include methods and corresponding systems and computer readable mediums for simulating a robotic program of an industrial robot. A method includes receiving inputs on a robotic program of a robot. The robotic program of the robot is represented with a neutral representation modeled with a neutral language. The method includes mapping specific code portions of the robotic program in the neutral representation with corresponding specific code portions of a native representation modeled with a native language of the robot. The method includes simulating the robot program in one of the neutral representation and the native representation. Corresponding code portions of the neutral representation and of the native representation of the robotic program are synchronized via the mapping.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 1 illustrates a block diagram of a data processing system in which an embodiment can be implemented;

FIGS. 2A, 2B, 2C illustrates an example of native language code of a robotic program with inserted tags in accordance with disclosed embodiments;

FIG. 3 schematically illustrates robotic program viewer including neutral and native representations in accordance with disclosed embodiments;

FIG. 4 illustrates a flowchart of a method for simulating a robotic program of an industrial robot in accordance with disclosed embodiments.

DETAILED DESCRIPTION

Figure 3:
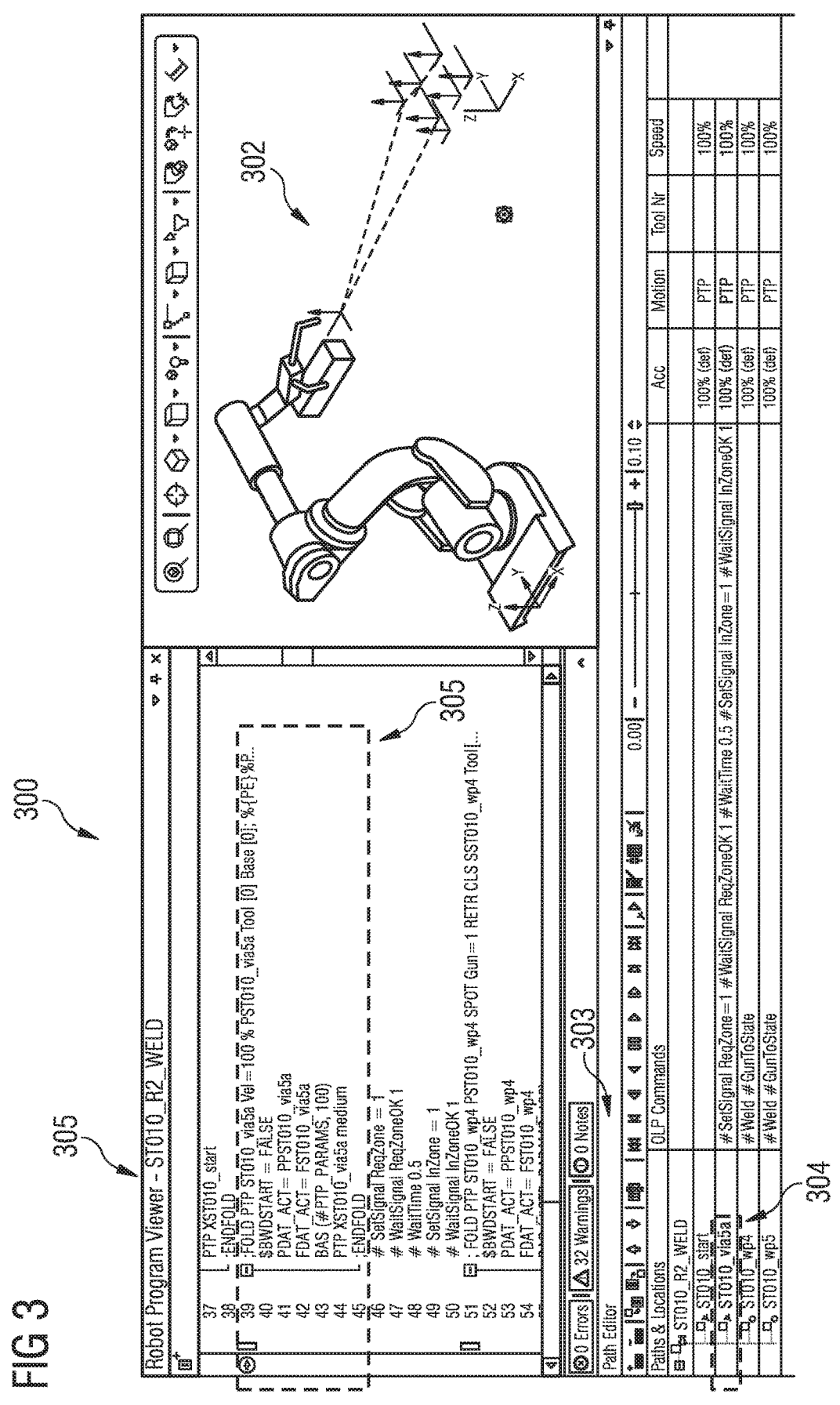

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Embodiments enhance the simulation capabilities of robotic simulation applications.

Embodiments support the robotic engineers in performing their robotic simulation tasks in user friendly and easy manners, in particularly when dealing with a manufacturing scenario having robots of multiple vendors.

Embodiments enable synchronizing the robotic simulation in two representations in a parallel manner.

Embodiments enable to break down the native robotic program in code portions so that the user is enabled to know at a given time which motion or logic the robot is performing, e.g. robot target, specific OLP command, etc.

Embodiments enable the user to verify the same logic in parallel with two different representations, a neutral one and a native one.

Embodiments enable to increase the productivity and the efficiency of robotic simulation application by enabling robotic engineers to concurrently operate in the language they are familiar with.

Embodiments enable an improved control by breaking down the views of the executed code, in addition to the high level views provided with the neutral language representation.

Embodiments allows skilled robot programmer to see the executed program in native language of the specific robot controller.

Embodiments also allows commonality in one approach so that the program can be visualized in a common language for all controllers and in the same time it can be detailed or have detailed and unique representation for each controller, without the need to maintain the generic code of the simulation environment. Advantageously, native language expert users may sit together with neutral language expert users to resolve a problem within one virtual simulation system.

Embodiments enable improved capability during the verification process of a robotic program.

Embodiments enable offline robotic code synchronization of different robots within a virtual simulation system.

Embodiments enable improved OLP programming of robots.

FIG. 1 illustrates a block diagram of a data processing system 100 in which an embodiment can be implemented, for example as a PDM system particularly configured by software or otherwise to perform the processes as described herein, and in particular as each one of a plurality of interconnected and communicating systems as described herein. The data processing system 100 illustrated can include a processor 102 connected to a level two cache/bridge 104, which is connected in turn to a local system bus 106. Local system bus 106 may be, for example, a peripheral component interconnect (PCI) architecture bus. Also connected to local system bus in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure can include an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

FIGS. 2A, 2B, 2C illustrates an example of native language code of a robotic program with inserted tags in accordance with disclosed embodiments.

FIG. 3 schematically illustrates robotic program viewer including neutral and native representations in accordance with disclosed embodiments.

In embodiments, the robotic program of a robot is received as input. With the terms "robotic program" it is herein intended virtual robotic program/operation, whereby a virtual program may contain several operations for the same robots. In other embodiments, received inputs may include a virtual representation of the robot, a virtual representation of the environment (e.g. 3D study, cell with its contents).

FIG. 2A-2C illustrates an exemplary robotic program represented with a native representation modeled with a native language specific for KUKA robots. FIG. 3 illustrates another example of native representation in a robot native language code, on the upper left section 301 of the robotic program viewer 300.

In embodiments, the robotic program of the robot may conveniently be received in a native representation, for example via upload. The robotic program is then represented in a neutral representation by converting the native representation into a neutral representation. This may be conveniently done for example within a virtual simulation environment having such capability.

In other embodiments, the robotic program is received in a neutral representation. Examples include receiving a robotic program from a repository or obtaining it via modeling within the virtual simulation environment.

In other embodiments, a mix of the above may advantageously be possible. For example, a robotic program in native language received via upload is modeled with some changes in a neutral representation as for example by adding new locations and OLPs within the virtual simulation system.

In embodiments, the virtual simulation system is provided with the capability of simulating the received robotic program with a neutral representation modeled with a neutral language.

In embodiments, the robotic programs in neutral language representation may preferably contain 3D objects, high level OLP commands and/or other virtual objects (e.g. parts, signals, tools etc.), 3D locations with parameters for motion instructions, OLP Commands objects, attached to the parent operation or location, for non-motion instructions. Other virtual objects may for example be a paint trigger where e.g. once the robot reach the trigger position, the paint gun changes its brush.

In embodiments, the robotic program is simulated in a neutral representation. Advantageously, it is possible to perform the relevant virtual validations and modifications in a natural representation.

In FIG. 3, a neutral representation is shown in the graphic section 302 and with the path editor viewer 303 including text descriptions in higher level language.

Specific code portions of the robotic program in the neutral representation are mapped with corresponding specific code portions of a native representation modeled with a native language of the robot.

In embodiments, the mapping may be done at the beginning.

In embodiments, the mapping may be done upon notifications, for example in case of user requests, changes, errors and other types of notifications.

In embodiments, it is automatically recognized a change in the natural language program or in its twin program in native language, for example by detecting changes in the downloaded file, and the mapping is accordingly generated or updated.

The mapping may conveniently be performed during a download of the robotic program. The mapping may be done by inserting tags in the native language code of the robotic programs and/or by making use of a cache mapping table.

For example, the system controller downloads the robotic program in a special silent mode. During this special download, specific tags are inserted in the robotic program native syntax code in order to synchronize the program lines in native syntax with the system objects of the neutral representation. In embodiments, the mapping may advantageously be cached in a table as alternative to the tags in the native code or in addition to it.

In embodiments, for each robot of the virtual simulation systems, the following steps are performed:
the controller of the system downloads the robotic program in a special silent mod
during this special download, the controller inserts specific tags in the robotic program in native syntax in order to synchronize the program lines in native syntax with the system objects (e.g. the operations, the location, the OLP commands, etc.).

In embodiments, the mapping may advantageously be cached. A cached version of the mapping may advantageously improve speed simulation performances. Table 1 is an exemplary embodiment of cache table referring to the tags inserted in the exemplary native code of FIGS. 2A-2C.

TABLE 1

| Key | Line numbers |
| --- | --- |
| TX_OP_001 | 7 |
| TX_CMD_001 | 8 |
| TX_CMD_002 | 10 |
| TX_LOC_001 | 12-14 |
| . . . | . . . |

In the exemplary embodiment of Table 1, the keys in Table 1 object names which are mapped with the corresponding robotic program lines written in the native code. In other embodiments, the keys may be object IDs. In the example of Table 1, the prefix TX is an acronym for Tecnomatix. The tag TX_OP_001 refers to the start of a new operation until the next operation tag TX_OP_i. The tag TX_CMD_001 refers to the start of a new command until any tag is encountered TX_CMD_i; TX_OP_i, TX_LOC_i. The tag TX_LOC_001 refers to the start of a new location until the next operation tag or location tag is encountered, TX_OP_i or TX_LOC_i.

In FIG. 2, the tags 201 inserted within the native code are highlighted in grey shading.

During the simulation, based on the above mentioned mapping, and also on possible notifications from the controller, the virtual simulation system can show the program code in native language and highlights the current simulated lines based on the current simulated objects.

In the exemplary embodiment of FIG. 3, in the neutral representation of the bottom pane of the robot program viewer screen, during simulation, a location "via5a" is highlighted 304 and conveniently the corresponding lines 305 in the native language code are highlighted as well based on the mapping. In FIG. 3 the highlighted native code lines 305 are lines 39 to 45 and the highlighted neutral code portion 304 is the location object "via5a". Advantageously, a double representation is provided in parallel, also during simulation, for example by showing a 3D location where the robot is moving to and the corresponding lines in the robotic program native code.

In case that the simulation is stopped, the system can advantageously show all robot variables and signals names vs their values in order to give better understanding.

FIG. 4 illustrates a flowchart 400 of a method for simulating a robotic program of an industrial robot. Such a method can be performed, for example, by system 100 of FIG. 1 described above, but the "system" in the process below can be any apparatus configured to perform a process as described.

At act 405, inputs on a robotic program of a robot is received.

At act 410, representing the robotic program of the robot with a neutral representation modeled with a neutral language. In embodiments, a virtual simulation system is provided for simulating the robot with a neutral representation.

At act 415, specific code portions of the robotic program in the neutral representation are mapped with corresponding specific code portions of a native representation modeled with a native language of the robot.

At act 420, simulating the robot program in one of the neutral representation and of the native representation. In embodiments, the virtual simulation system is provided also with the capability of simulating the robot in a native representation. In embodiments, the relevant virtual validations and modifications are performed.

At act 425, corresponding code portions of the neutral representation and of the native representation of the robotic program are synchronized via the mapping of act 415. In embodiment, the virtual simulation system is provided with the capability to synchronize the corresponding code portions of the neutral and native representation during simulation. In embodiments, the simulation is executed in one representation and then it is advantageously synchronized with the other representation.

In embodiments, during simulation, synchronized code portions in native representation 305 and in neutral representation 304 are highlighted. In embodiments, it is possible to play the simulation by a virtual robot controller in native language and synchronize in the system in neutral language. Advantageously, embodiments enable to highlight the desired or current equivalent code portions 304, 305 in both languages.

As used herein the term "code portion" mean a portion of code and/or a virtual object like for example locations and OLP commands. In fact, natural representations, virtual objects are actually a real part of the "code", given that the neutral language makes often use of high-level language and visual objects.

Embodiments may include a plurality of robots and a plurality of native representations.

In embodiments, an additional step includes downloading back into different program files with different native languages. In embodiments, upon successful validation phase, it is possible to download the robotic program for usage by the real robot.

In other embodiments, synchronized code portions with in native and natural representations may be used for debugging purposes. For example, in embodiments, an expert user may wish to read the robotic program in the robotic native language in order to check the logic in a phase other than simulation time. In other embodiments, another user may wish to compare the robotic program to another program. Advantageously, users are able to do minors modifications to the neutral language code and see the outcomes in the native language code.

In embodiments, during the simulation, based on the above mentioned mapping, and notifications on system objects from the controller simulation, the system can show the program code in native language and highlights the current simulated lines based on the current simulated objects.

In case that the simulation is stopped, the system can show all robot variables and signals names vs their values in order to improve usability. Additionally, it may have also "Edit capabilities" so that the user is able to modify their values and continue with the simulation (e.g. by changing the value of a signal).

Embodiments are helpful in the following use case scenario: the user starts the common simulation and the simulation stops with error; the user sees something wrong; the user is able to open the viewer of the native code, the silent download is performed and the table mapping is created, so that the user is able to see the current native code. Hence, in embodiments, download and mapping may be performed at a later stage upon request.

Other embodiments may include: downloading the robotic program (in native language) into the robot controller; connect to the virtual robot controller via a dedicated API to execute the downloaded robotic program line after line; synchronizing both systems to work on the same simulation clock; and, user is enabled to view the lines being simulated in the virtual robot controller and the actual 3D motion in the system.

Other embodiments may include: at simulation time, for each location, for each OLP command, the system controller does "mini downloads"; and the system visualizes for the user the current "mini-download" lines.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims.

What is claimed is:
1. A data processing system, comprising:
a processor; and
an accessible memory; and
wherein the data processing system is configured to:
a) receive inputs on a robotic program of a robot;

b) represent the robotic program of the robot with a neutral representation modeled with a neutral language;

c) map specific code portions of the robotic program in the neutral representation with corresponding specific code portions of a native representation modeled with a native language of the robot;

d) play a simulation of the robot program in one of the neutral representation and of the native representation; and e) synchronize corresponding code portions of the neutral representation and of the native representation of the robotic program via the mapping of paragraph c);

wherein the data processing system is configured to perform the mapping of paragraph c) by inserting tags in the native code and/or by using a caching table; and wherein the data processing system is configured to perform the mapping of paragraph c) during a download of the robot program.

2. A method for simulating, by a data processing system, a robotic program of an industrial robot, the method comprising the following steps:

a) receiving inputs of a robotic program of a robot;

b) representing the robotic program of the robot with a neutral representation modeled with a neutral language;

c) mapping specific code portions of the robotic program in the neutral representation with corresponding specific code portions of a native representation modeled with a native language of the robot, wherein the mapping of step c) is implemented by inserting tags in the native code and/or by using a caching table;

d) playing a simulation of the robot program in one of the neutral representation and of the native representation;

e) synchronizing corresponding code portions of the neutral representation and of the native representation of the robotic program via the mapping of step c); and while playing the simulation, showing on a display, a portion of the code of the neutral representation currently being simulated and showing on the display, a portion of the code of the native representation currently being simulated, wherein the portion of the code of the neutral representation currently being simulated and the portion of the code of the native representation currently being simulated are synchronized with each other.

3. A method for simulating, by a data processing system, a robotic program of an industrial robot, the method comprising the following steps:

a) receiving inputs of a robotic program of a robot;

b) representing the robotic program of the robot with a neutral representation modeled with a neutral language;

c) mapping specific code portions of the robotic program in the neutral representation with corresponding specific code portions of a native representation modeled with a native language of the robot, wherein the mapping of step c) is implemented by inserting tags in the native code and/or by using a caching table;

d) playing a simulation of the robot program in one of the neutral representation and of the native representation;

e) synchronizing corresponding code portions of the neutral representation and of the native representation of the robotic program via the mapping of step c); and while playing the simulation, highlighting on a display, a portion of the code of the neutral representation currently being simulated and, highlighting on the display, a portion of the code of the native representation currently being simulated, wherein the portion of the code of the neutral representation currently being simulated and the portion of the code of the native representation currently being simulated are synchronized with each other.

* * * * *